(12) United States Patent
Kamada et al.

(10) Patent No.: US 8,317,029 B2
(45) Date of Patent: Nov. 27, 2012

(54) WAFER STORAGE CONTAINER

(75) Inventors: Toshiyuki Kamada, Saitama (JP); Hidehiro Masuko, Saitama (JP)

(73) Assignee: Shin-Etsu Polymer Co., Ltd., Tokyo (JP)

( * ) Notice: Subject to any disclaimer, the term of this patent is extended or adjusted under 35 U.S.C. 154(b) by 93 days.

(21) Appl. No.: 12/899,965

(22) Filed: Oct. 7, 2010

(65) Prior Publication Data

US 2011/0079539 A1    Apr. 7, 2011

(30) Foreign Application Priority Data

Oct. 7, 2009 (JP) .................................. 2009-233423

(51) Int. Cl.
     *B65D 85/48* (2006.01)
(52) U.S. Cl. ........................................ 206/711; 206/710
(58) Field of Classification Search ................... 206/710, 206/711, 454; 414/217, 217.1, 219; 211/41.18
See application file for complete search history.

(56) References Cited

U.S. PATENT DOCUMENTS

| | | | | |
|---|---|---|---|---|
| 6,098,809 A | * | 8/2000 | Okada et al. | 206/711 |
| 6,105,782 A | * | 8/2000 | Fujimori et al. | 206/710 |
| 6,273,261 B1 | * | 8/2001 | Hosoi | 206/711 |
| 2003/0107187 A1 | * | 6/2003 | Yajima et al. | 277/628 |
| 2004/0074808 A1 | * | 4/2004 | Bhatt | 206/711 |
| 2005/0109667 A1 | * | 5/2005 | Burns et al. | 206/710 |
| 2005/0115866 A1 | * | 6/2005 | Burns et al. | 206/710 |
| 2007/0108095 A1 | * | 5/2007 | Burns et al. | 206/710 |
| 2007/0193907 A1 | * | 8/2007 | Bhatt et al. | 206/449 |

FOREIGN PATENT DOCUMENTS

| | | |
|---|---|---|
| JP | 2000-058633 A | 2/2000 |
| JP | 2006-505921 T | 2/2006 |

* cited by examiner

*Primary Examiner* — David Fidei
(74) *Attorney, Agent, or Firm* — Osha Liang LLP

(57) ABSTRACT

A wafer storage container including a container body having an opening adapted to store wafers is disclosed. The container body includes a window and wafer support parts. Delivery components are attached to the exterior face part of the container body. The delivery components includes a bottom plate disposed at a bottom of the container body, a pair of side handles disposed at both sides of the container body, and a robotic flange disposed at a top of the container body. The container further is provided with a lid adapted to seal the opening of the container body. The lid includes a lid main body, a pair of latch mechanism disposed within the lid main body, a retainer member disposed at an inner surface of the lid main body, a seal gasket member disposed at a periphery of the lid main body such that it contacts a periphery of an opening part of the container body and a lid cover. The container body, the delivery components and the lid main body are formed of a self-extinguishing material, and the latch mechanism and the retainer member are formed of PEEK, and the gasket member is formed of elastomeric resin.

9 Claims, 5 Drawing Sheets

(Example 1)

| WAFER STORAGE CONTAINER | | SELF-EXTINGUISHING MATERIAL | NON SELF-EXTINGUISHING MATERIAL |
|---|---|---|---|
| 2 | Container main body | PEI + CF | |
| X2 | Window | PEI (transparent) | |
| 11 | Wafer support parts | PEI + CF | |
| 4 | ROBOTIC FLANGE | | |
| 5 | Plate shape part | PEI + CF | |
| 6 | Attachment part | | |
| 12 | SIDE HANDLE | | |
| 13 | Base body part | | |
| 14 | Grip part | PEI | |
| 15 | Latch part | | |
| 16 | Engagement part | | |
| 7 | BOTTOM PLATE | PEI + CF | |
| | CARD CASE COMPONENTS (optional) | | |
| 8 | Card case holder (optional) | | PC (transparent) |
| 9 | card case (optional) | | PC (transparent) |
| 10 | Tag (optional) | | PC (transparent) |
| 17 | SIDE RAIL (optional) | PEI + CF | |
| 18 | Flat plate shaped part | | |
| 3 | Lid main body | PEI + CF | |
| 19 | Latch mechanism | PEEK | |
| 20 | Retainer | PEEK | |
| 21 | Gasket member | | Fluoro-rubber |
| X1 | Surface plate (lid cover) | PEI (transparent) | |

Fig. 4  (Example 1)

| WAFER STORAGE CONTAINER | | SELF-EXTINGUISHING MATERIAL | NON SELF-EXTINGUISHING MATERIAL |
|---|---|---|---|
| 1 | CONTAINER BODY | | |
| 2 | Container main body | PEI + CF | |
| X2 | Window | PEI (transparent) | |
| 11 | Wafer support parts | PEI + CF | |
| X | DELIVERY COMPONENTS | | |
| 4 | ROBOTIC FLANGE | | |
| 5 | Plate shape part | PEI + CF | |
| 6 | Attachment part | | |
| 12 | SIDE HANDLE | | |
| 13 | Base body part | | |
| 14 | Grip part | PEI | |
| 15 | Latch part | | |
| 16 | Engagement part | | |
| 7 | BOTTOM PLATE | PEI + CF | |
| | CARD CASE COMPONENTS (optional) | | |
| 8 | Card case holder (optional) | | PC (transparent) |
| 9 | card case (optional) | | PC (transparent) |
| 10 | Tag (optional) | | PC (transparent) |
| 17 | SIDE RAIL (optional) | PEI + CF | |
| 18 | Flat plate shaped part | | |
| Y | LID | | |
| 3 | Lid main body | PEI + CF | |
| 19 | Latch mechanism | PEEK | |
| 20 | Retainer | PEEK | |
| 21 | Gasket member | | Fluoro-rubber |
| X1 | Surface plate (lid cover) | PEI (transparent) | |

Fig. 5  (Example 2)

| WAFER STORAGE CONTAINER | | | SELF-EXTINGUISHING MATERIAL | NON SELF-EXTINGUISHING MATERIAL |
|---|---|---|---|---|
| 1 | CONTAINER BODY | | | |
| | 2 | Container main body | LCP + CF | |
| | 11 | Wafer support parts | LCP + CF | |
| X | DELIVERY COMPONENTS | | | |
| | 4 | ROBOTIC FLANGE | | |
| | 5 | Plate shape part | PEI + CF | |
| | 6 | Attachment part | | |
| | 12 | SIDE HANDLE | | |
| | 13 | Base body part | | |
| | 14 | Grip part | PEI | |
| | 15 | Latch part | | |
| | 16 | Engagement part | | |
| | 7 | BOTTOM PLATE | PEI + CF | |
| | CARD CASE COMPONENTS (optional) | | | |
| | 8 | Card case holder (optional) | | PC (transparent) |
| | 9 | card case (optional) | | PC (transparent) |
| | 10 | Tag (optional) | | PC (transparent) |
| Y | LID | | | |
| | 3 | Lid main body | LCP + CF | |
| | 19 | Latch mechanism | PEEK | |
| | 20 | Retainer | PEEK | |
| | 21 | Gasket member | | Polyester thermoplastic elastomer |
| | X1 | Surface plate (lid cover) | PEI (transparent) | |

Fig. 6  (Example 3)

| WAFER STORAGE CONTAINER | | | SELF-EXTINGUISHING MATERIAL | NON SELF-EXTINGUISHING MATERIAL |
|---|---|---|---|---|
| CONTAINER BODY | 1 | | | |
| | 2 | Container main body | PEI | |
| | 11 | Wafer support parts | PEI + CF | |
| DELIVERY COMPONENTS | X | | | |
| ROBOTIC FLANGE | 4 | | | |
| | 5 | Plate shape part | PEI + CF | |
| | 6 | Attachment part | | |
| SIDE HANDLE | 12 | | | |
| | 13 | Base body part | PEI | |
| | 14 | Grip part | | |
| | 15 | Latch part | | |
| | 16 | Engagement part | | |
| BOTTOM PLATE | 7 | | PEI + CF | |
| CARD CASE COMPONENTS (optional) | | | | |
| | 8 | Card case holder (optional) | | PS (transparent) |
| | 9 | card case (optional) | | PS (transparent) |
| | 10 | Tag (optional) | | PS (transparent) |
| LID | Y | | | |
| | 3 | Lid main body | PEI (transparent) | |
| | 19 | Latch mechanism | PEEK | |
| | 20 | Retainer | PEEK | |
| | 21 | Gasket member | | Polyester thermoplastic elastomer |
| | X1 | Surface plate (lid cover) | PEI (transparent) | |

WAFER STORAGE CONTAINER

CROSS-REFERENCE TO RELATED APPLICATIONS

This Application claims priority to Japanese Patent Application No. 2009-233423 filed on Oct. 7, 2009 in Japan.

BACKGROUND OF INVENTION

1. Field of the Invention

The present invention generally relates to a wafer storage container used for storage, shipping, archiving, or the like of a precision wafer such as a semiconductor wafer.

2. Background Art

A wafer storage container for storage of a semiconductor wafer (e.g. precision wafer) is required to allow automatic handling and must have good hermetic sealing in order to prevent contamination of the precision wafer. Synthetic resin material constituting the wafer storage container is selected in order to minimize as much as possible effects of outgassing or elution of ions from the synthetic plastic material. As disclosed by Japanese Unexamined Laid-open Patent Application No. 2000-58633 JP2000-58633, synthetic resins have been used as materials suitable for such a storage container, in which the container body is a high purity polycarbonate produced using a low amount of additives and having had residual catalyst and organic solvent removed as much as possible during the material pellet production process, and in which a synthetic resin, such as polybutylene terephthalate, polyether ether ketone, or the like, has been used for the parts requiring sliding ability (e.g. parts contacting the wafer and parts for positioning against equipment).

In order to move the wafer storage container during the manufacturing process of semiconductor or shipment of semiconductor wafers, various delivery components such as side handles, a top (robotic) flange, bottom plate and a side rails, are attached to an exterior face of the container body. For those delivery components, polycarbonate has been preferably used because of its excellent properties such as moldability, dimensional stability and rigidity.

The above-described type of storage container is formed from synthetic resin that readily burns and causes increased damage when a fire occurs within a semiconductor manufacturing process while the wafer storage container is kept in storage at an in-process semiconductor manufacturing storage warehouse. In order to mitigate that problem, forming the door from a fire retardant resin, as described in Japanese Unexamined Laid-open Patent Application No. 2006-505921 (JP2006-505921), has been proposed as a countermeasure to combat this problem.

However, when the conventional wafer storage containers formed from polycarbonate resin as disclosed in JP2000-58633 and JP2006-505921 are lined up on a rack in the storage warehouse as shown in FIG. 1, the surface of the door becomes exposed at the front. Also, the robotic handle used for delivery of the wafer storage container is attached so as to protrude from the exterior wall of the top face of the container body 1, and handles used for manual delivery are attached to the left and right side walls. Thus gaps exist at the upper faces of vertically adjacent racks in order to allow insertion and removal of wafer storage containers. Gaps also exist between laterally adjacent wafer storage containers to allow insertion and removal.

Thus, if the door alone is formed from fire retardant material and the wafer storage containers are stored next to each other without gaps between adjacent wafer storage containers and also the door faces exposed at the storage rack are formed from fire retardant material, prevention of the spread of fire is possible to a certain degree. However, due to placement of delivery components such as robotic handles between vertically adjacent wafer storage containers and due to the placement of side handles between horizontally adjacent storage containers, gaps are actually present to allow insertion and removal of the wafer storage containers. When a fire occurs, the tip of the spreading flame wraps around adjacent wafer storage containers through the lateral and vertical gaps. Because the robotic handles and side handles, which are formed from readily burned synthetic resin, are present in these gaps, the fire readily spreads in the adjacent wafer storage containers. This type of wafer storage container is deficient in that this spreading of the fire causes the adjacent wafer storage containers to burn one after another.

Side rails are also provided at the side walls of the wafer container, and a bottom plate is provided at the bottom part of the wafer container. A card case holder, into which can be inserted a card case or the like for identification, is attached to the back face of the container body 1. If these side rails, the bottom plate, and the card case holder are formed from normal synthetic resin such as polycarbonate, these parts become highly combustible and promote the spread of a fire.

SUMMARY OF INVENTION

A wafer storage container of an embodiment of the present invention comprises a container body having an opening adapted to store wafers, the container body comprising a window and wafer support parts; delivery components attached to the exterior face part of the container body, the delivery components comprising a bottom plate disposed at a bottom of the container body, a pair of side handles disposed at both sides of the container body, and a robotic flange disposed at a top of the container body; and a lid adapted to seal the opening of the container body, the lid comprising a lid main body, a pair of latch mechanism disposed within the lid main body, a retainer member disposed at an inner surface of the lid main body, a seal gasket member disposed at a periphery of the lid main body such that it contacts a periphery of an opening part of the container body, and a lid cover. The container body, the delivery components and the lid main body are formed of a self-extinguishing material, and the latch mechanism and the retainer member are formed of PEEK, and the gasket member is formed of elastomeric resin.

According to one or more embodiments of the present invention, the self-extinguishing material employed to the wafer storage container may be a flame retardant synthetic resin material that includes: a thermoplastic resin as one or more type selected from among the group including liquid crystal polymers, polyetherimides, polyether ether ketones, polyphenylene sulfones, polybutylene terephthalates, polyethylene terephthalates, and polycarbonates, or the like, and an inorganic flame retardant agent selected as one or more type selected from the group including halogenated type flame retardant agents and phosphorous type flame retardant agents.

The term "self-extinguishing" may be defined as the property of burning when contacted by an igniting flame and of then quenching the resultant flame when separated from the igniting flame. As specified by JIS K6911, a material is determined to have self-extinguishing ability if burning of a test sample is extinguished within 180 seconds after the igniting flame is withdrawn and if the length of the burn is 25 mm to 100 mm, inclusive.

According to one or more embodiments of the present invention, because each of the types of attachment members provided at the exterior surface of the wafer storage container is formed from a self-extinguishing material, even if a flame is generated during storage of the wafer storage container, spread of fire to adjacent wafer storage containers can be effectively prevented. As the self-extinguishing material of this invention, polyetherimide and/or liquid crystal polymer may be preferably used.

According to one or more embodiments of the present invention, non-self extinguishing material such as polycarbonate, elastomeric polymer, etc. are used as components of the storage container which are not exposed outside. Therefore, requirements to the wafer storage container such as prevention of particle generation, particle adhesion, abrasion resistance, electrical conductivity etc. can be met while the requirement of suppression of spread of fire at the time of occurrence of fire in a semiconductor manufacturing plant or container storage warehouse is met.

Other aspects and advantages of the invention will be apparent from the following description and the appended claims.

BRIEF DESCRIPTION OF DRAWINGS

FIG. 4 shows a table of components and materials of the components of the wafer storage container according to an embodiment of the present invention.

FIG. 5 shows a table of components and materials of the components of the wafer storage container according to another embodiment of the present invention.

FIG. 6 shows a table of components and materials of the components of the wafer storage container according to another embodiment of the present invention.

DETAILED DESCRIPTION

Figure 1:
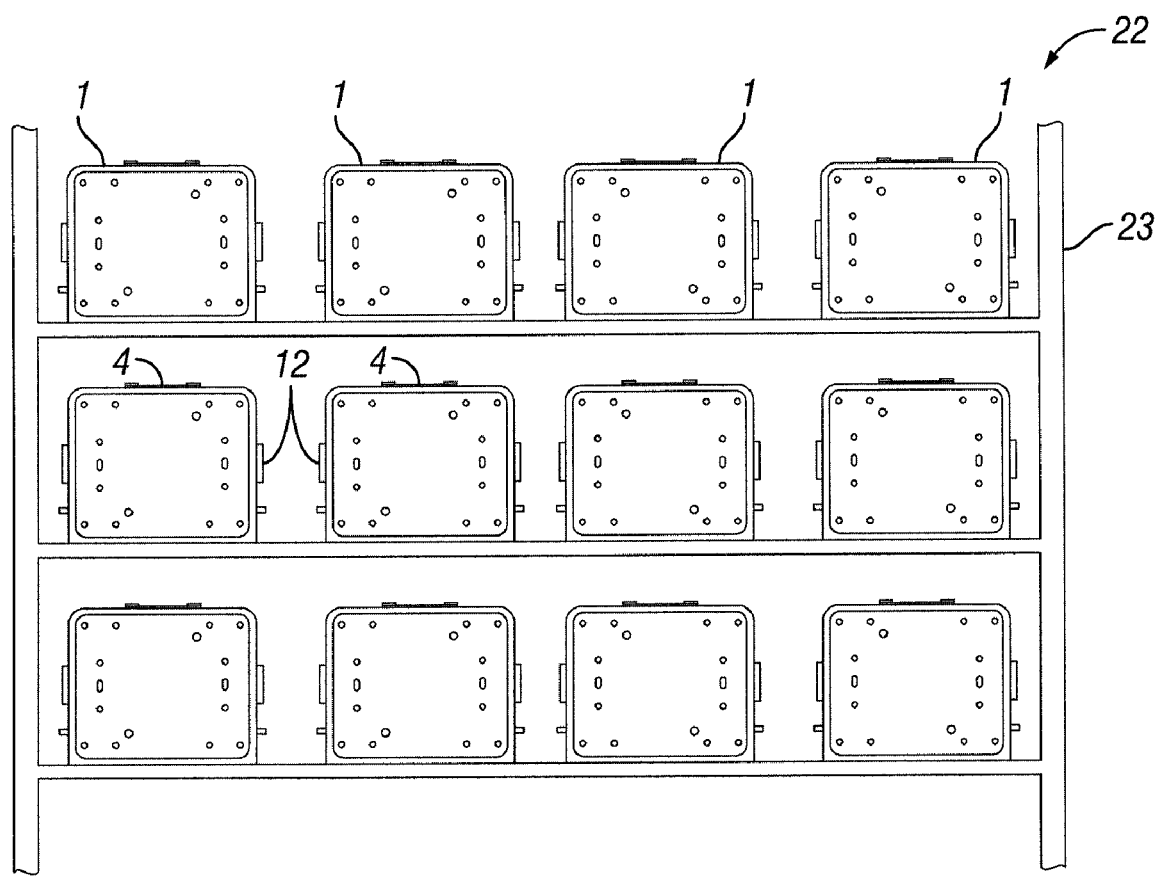
FIG. 1 shows a side view of wafer storage containers lined up on a rack in storage warehouse.
Figure 2:
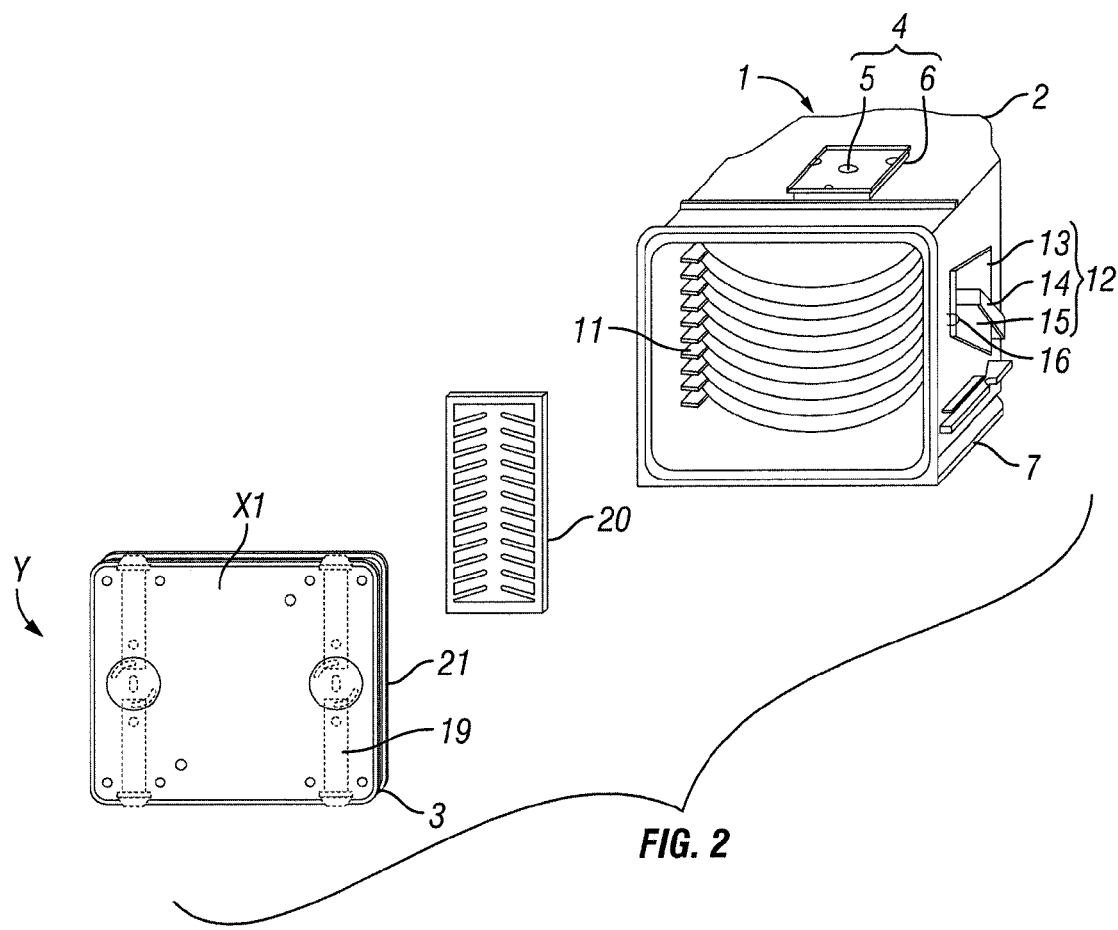
FIG. 2 shows a tilted-perspective illustrated parts breakdown showing the wafer storage container according to one or more embodiments of the present invention.
Figure 3:
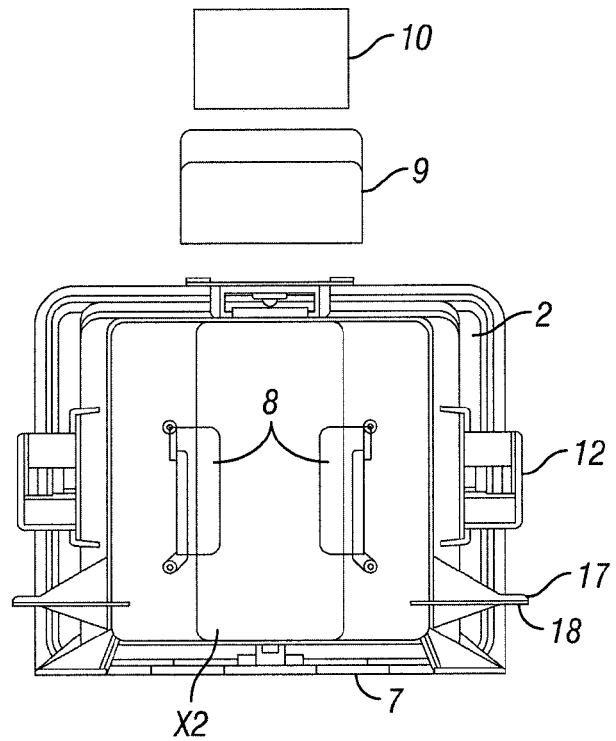
FIG. 3 shows a rear view showing the wafer storage container according to one or more embodiments of the present invention.

One or more preferred embodiments of the wafer storage container of the present invention will be described below with reference to the figures. FIG. 2 is a tilted perspective illustrated parts breakdown showing a wafer storage container 1. FIG. 3 is a rear view of the wafer storage container 1. The wafer storage container 1 is formed from a container main body 2, delivery components X, and a lid Y. An opening part is formed at the front face of the container main body 2, and an outwardly extending flange part is formed at the opening part peripheral edge at four sides of the opening part. The lid Y is capable of closing and sealing the opening part of the container main body 2. As shown in FIG. 2, wafer support parts 11 are opposingly formed at the inner faces of the left and right side walls of the container main body 2. The wafer support parts 11 have racks for supporting the wafers in a horizontal orientation with fixed intervals between the wafers.

Delivery component as used herein means components of wafer storage container attached to an exterior face of container body to be used for manually or automatically delivering or handling the wafer storage container in a semiconductor manufacturing place or shipping the wafer storage container to another location. Delivery components may include a robotic flange, side rails, side handles, bottom plate, and card case components.

As one of the delivery components X, robotic flange 4 is attached to the top wall of the container main body 2 for automated delivery of the wafer storage container. The robotic flange 4 includes a plate shaped part 5, which is disposed at the top part of the robotic flange 4, and an attachment part 6 supporting the plate shaped part 5 and attached to an engagement part provided on the container body.

A bottom plate 7 is attached to the bottom wall of the container main body 2, and a positioning member or a guide part of a positioning member disposed at the bottom face of the container main body 2 is provided for highly precise positioning of the wafer storage container in the processing equipment. The bottom plate 7 is formed as a plate shaped member and is fixed by bolts to positioning ribs provided on the bottom part of the container main body 2. The bottom plate 7 is equipped with various types of sensing pads, identification holes, components for mounting on the processing equipment, or the like.

As shown in FIG. 3, card case components are optionally attached to the backside face of the container main body 2. The card case components include a card case holder 8, a card case 9 and a tag 10. This card case holder 8 is capable of holding writing or a tag 10 containing instructions or information for the operator during the process utilizing the wafer storage container 1.

A pair of side handles 12 is attached to the left and right exterior walls of the container body 1 for manual handling. Each side handle 12 includes a base body part 13, a grip part 14 erected on the base body part 13, and a latch part 15 provided on the base part of the base body part 13. The side handles 12 engage with engagement parts 16 provided at either side wall of the container main body 2.

A pair of side rails 17 (FIG. 3) can be attached to the left and right exterior side walls of the container main body 2 as optional components. The side rail 17 is equipped at the lower face with a flat plate shaped part 18. The flat plate shaped parts 18 are picked up by forklift fork-shaped parallel tines for delivery of the wafer storage container.

The lid Y has a roughly rectangular shape and contains a lid main body 3 and a latch mechanism 19 for latching the lid main body 3 to the container main body 2. The latch mechanism 19 is mentioned in detail in a previous patent application (Japanese Patent Application No. 2009-211266), and a detailed explanation will be omitted. This latch mechanism 19 has a rotating body, which has a key groove capable of being operated from the exterior, and a coupling bar member capable of moving in and out of a through hole in the side face of the lid body and engaging the rotating body. The coupling bar member moves so that the free tip part of this coupling bar member protrudes from the side wall, latches with an engagement concave part of the container body 1, and causes the lid body to engage the container main body 2. A retainer 20 is disposed at the inner face of the lid main body 3 for retaining the wafers.

A seal gasket member 21 is formed at the periphery of the lid main body 3 and contacts the periphery of the opening part of the container main body 2 to form a seal. The seal gasket member 21 has a loop-shaped base part, a seal piece protruding from the base part and contacting the opening periphery of the container main body 2, and an engaging protuberance for prevention of mispositioning of the base part and for engaging with an engagement groove provided in the lid body face. The seal piece has a curved part and a tilted part. The seal piece is provided to contact the peripheral edge of the opening part of the container body 1 and to form a seal due to suitable flexing force so as to prevent external gas from entering the wafer storage container and contaminating the wafers.

Specifically, the seal piece can be formed from a polyester, polyolefin, polystyrene, etc. type thermoplastic elastomer or a fluoro-rubber, IR rubber, etc. rubber material that has a hardness less than or equal 80 degrees as determined by JIS K7202.

In the wafer storage container of one or more embodiments of the present invention, lid main body 3, robotic handle 4, the side handle 12, bottom plate 7, side rail 17, card case holder 8, and card case 9 or tag 10 inserted in the card case holder 8 can be formed from a resin selected from among a group of self-extinguishing flame retardant resins. The self-extinguishing material may be formed by addition of an appropriate amount (e.g. 0.5 to 30 weight parts per 100 weight parts of thermoplastic resin) of a halogen type or phosphorous type inorganic flame retardant to a thermoplastic resin such as a liquid crystal polymer, polyetherimide, polyether ether ketone, polyphenylene sulfone, vinyl chloride type resin, or polybutylene terephthalate, polyethylene terephthalate, polycarbonate, or the like.

The utilized flame retardant is exemplified by: halogenated flame retardants such as chlorinated polyethylene, chlorinated paraffin, tetrabromophenol, tetrabromodiphenyl ether, or the like; hydrates of inorganic metals compounds (e.g. hydrates of aluminum hydroxide, magnesium hydroxide, dolomite, hydrotalcite, calcium hydroxide, barium hydroxide, basic magnesium carbonate, zirconium hydroxide, tin oxide, etc.); inorganic flame retardants such as zinc borate, zinc metaborate, barium metaborate, zinc carbonate, magnesium carbonate, calcium carbonate, barium carbonate, or the like; and phosphorous type flame retardants such as red phosphorous, inorganic phosphates such as ammonium polyphosphate or the like, halogen-free phosphate esters, organic phosphorous compounds, or the like. A combination of such flame retardants can also be used.

The container main body 2, lid main body 3 and delivery components X may be formed from polyetherimide (PEI) or liquid crystal polymer (LCP). As the material used for the components of wafer storage container, PEI has excellent property in its moldability and visibility in addition to the self-extinguishing property. But it has drawback in that it has large water absorbency. LCP has excellent property in its low water absorbency in addition to the self-extinguishing property. However, it has drawback in its poor moldability and high cost. LCP which may be used for forming the components of wafer storage container of this invention may be 1) Polycondensation polymer of Ethylene Terephthalate and Palla hydroxybenzoic acid 2) Polycondensation polymer of Phenol, Phthalic acid, and Palla Hydroxybenzoic acid 3) Polycondensation polymer of 2,6-Hydroxynaphthoic acid and Palla Hydroxybenzoic acid.

Particularly, conductive polyetherimide which is formed by adding conductive compounds such as carbon fiber, carbon powder, carbon nanotube, metal fiber, metal oxide, or conductive polymer may be preferably used. Specifically, carbon fiber of 10-30 parts by weight may be added to polyetherimide of 100 parts by weight. In this composition, surface resistance may be adjusted to be $10^3$-$10^8 \Omega$. Appropriate amount of other conductive compound, such as carbon powder may be added to the carbon fiber. By forming the main part of the wafer storage container from conductive material, adhesion of particles to the wafer storage container can be greatly decreased.

As the material used for forming wafer storage container, it is preferable that total volume of volatile organic gas which is generated by thermal desorption from the material after leaving 60 minutes at 80° C. is 0.3 ppm or less. By controlling the volume of total outgas to be 0.3 ppm or less, organic contamination of the wafer can be minimized.

Lid cover (X1) of the lid 3 shown in FIG. 2 may be formed from a transparent polyetherimide such that the latch mechanism stored within the door can be seen through the door plate. Window component (X2) shown in FIG. 3 may be integrally formed at the backside wall of the wafer storage container 1 by using insert molding technique. In order that the wafer stored in the container as shown in FIG. 2 can be seen through from outside, transparent polyetherimide may be used as the material of the window X2. By using a transparent material for a part of the wafer storage container, inside of the container can be seen through from outside while maintaining self-extinguishing nature of the wafer storage container.

Liquid crystal polymer may be used as the material of container main body 2, lid main body 3 and delivery components of the wafer storage container 1. In particular, conductive liquid crystal polymer formed by adding conductive compounds such as carbon fiber, carbon powder, carbon nanotube, metal oxide, metal fiber, conductive polymer is preferably used for forming the components.

Example 1

FIG. 4 is Example 1 of a wafer storage container according to an embodiment of the invention. In this example 1, wafer storage container body and support and lid body of the wafer storage container body are formed of PEI having electrical conductivity due to addition of carbon fiber. A window formed of transparent PEI is provided at the backside wall of the container body such that inside of the container body can be seen through the window. The window is integrally formed with the container body by using insert injection molding.

A retainer formed on the inner surface of the lid body and a pair of latch mechanism provided within the lid body is formed of polyether ether ketone which shows excellent abrasion resistance property. Also, the lid cover of the lid is formed of transparent PEI so that operation of the latch mechanism can be seen through the lid cover from outside. Gasket member provided at peripheral edge of the lid body for sealing is formed of fluoro-rubber.

Among the delivery components of the storage container, a robotic flange provided at a top of the container body and a bottom plate provided at a bottom of the container body are formed of PEI having electrical conductivity due to addition of carbon fiber. Optional side rail formed of PEI having electrical conductivity due to addition of carbon fiber is provided at both side walls of the container body.

A pair of side handles is formed of PEI. By colorizing the side handles into various colors, it becomes possible to identify the wafer storage container for each processing step or specification. Card case components can be formed of polycarbonate.

Example 2

FIG. 5 is Example 2 of a wafer storage container according to an embodiment of the present invention. Container body and wafer supports and lid body provided with the container body of this example is formed of liquid crystal polymer (LCP) having electrical conductivity due to addition of carbon fiber. In order to provide electrical conductivity, carbon fiber of 10-30 weight parts is added to LCP of 100 weight parts. Surface resistance of this composition can be adjusted to be $10^3$-$10^8\Omega$. Other electrically conductive compound such as carbon powder may be added to the carbon fiber in appropriate amount. By forming main part of the wafer storage container by conductive material, adhesion of particles to the wafer storage container can be greatly reduced.

Retainer provided on an inner surface of lid for retaining wafers stored in the container and a pair of latch mechanism stored in the lid body is formed of polyether ether ketone having excellent abrasion resistance property. Also, lid cover provided on the lid main body is formed of transparent PEI such that operation of the latch mechanism within the lid body can be seen through from outside. Gasket member provided on the periphery of lid body is formed of thermoplastic polyester elastomer.

Among the delivery components, robotic flange provided on a top of the container body and bottom plate provided at the bottom of the container body are formed of PEI having excellent dimensional stability and electrical conductivity due to addition of carbon fiber.

A pair of side handles is formed of PEI. By colorizing the side handles into various colors, it becomes possible to identify the wafer storage container for each processing step or specification. Card case components can be formed of polycarbonate.

Example 3

FIG. 6 is Example 3 of a wafer storage container according to an embodiment of the present invention.

Retainer provided on an inner surface of lid for retaining wafers stored in the container and a pair of latch mechanism stored in the lid body is formed of polyether ether ketone having excellent abrasion resistance property. Also, lid cover provided on the lid main body is formed of transparent PEI such that operation of the latch mechanism within the lid body can be seen through from outside. Gasket member provided on the periphery of lid body is formed of thermoplastic polyester elastomer.

Among the delivery components of the storage container, a robotic flange provided at a top of the container body and a bottom plate provided at a bottom of the container body are formed of PEI having electrical conductivity due to addition of carbon fiber. Optional side rail formed of PEI having electrical conductivity due to addition of carbon fiber is provided at both side walls of the container body.

A pair of side handles is formed of PEI. By colorizing the side handles into various colors, it becomes possible to identify the wafer storage container for each processing step or specification. Card case components can be formed of polystyrene.

Wafer storage container used during the manufacturing process of semiconductor needs to meet various requirements from the semiconductor manufacturers. In order to meet such requirements, the wafer storage container of the present invention strategically uses a number of different materials for its components depending on the properties required for each of the components. Those requirements may include production cost, particle generation, static dissipation, and self-extinguishing property, etc. As for self-extinguishing property, when a fire occurs in the factory or storage warehouse and flames wrap around the wafer storage container through the space between adjacent wafer storage containers, the spread of fire can be suppressed so that damage due to fire can be minimized.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A wafer storage container comprising:
   a container body having an opening adapted to store wafers, the container body consisting essentially of PEI;
   delivery components attached to the exterior face part of the container body, the delivery components comprising a bottom plate disposed at a bottom of the container body, a pair of side handles disposed at both sides of the container body, and a robotic flange disposed at a top of the container body, the delivery components consisting essentially of PEI; and
   a lid adapted to seal the opening of the container body, the lid comprising
   a lid main body consisting essentially of PEI,
   a pair of latch mechanism consisting essentially of PEEK and disposed in the lid main body,
   a retainer member consisting essentially of PEEK and disposed at an inner surface of the lid main body,
   a seal gasket member consisting essentially of elastomeric resin and disposed at a periphery of the lid main body such that it contacts a periphery of an opening part of the container body, and
   a lid cover consisting essentially of PEI.

2. The wafer storage container according to claim 1, further comprising a pair of side rails disposed at both sides of the container body, wherein the pair of side rails are formed of PEI.

3. The wafer storage container according to claim 1, wherein the container body, the lid main body and the delivery components are formed of PEI and carbon fibers.

4. The wafer storage container according to claim 3, further comprising a pair of side rails wherein the pair of side rails is formed of PEI and carbon fibers.

5. The wafer storage container according to claim 1, wherein the container body, the lid main body and the delivery components are made electrically conductive by adding carbon fibers to the PEI.

6. A wafer storage container comprising:
   a container body having an opening adapted to store wafers;
   delivery components attached to the exterior face part of the container body, the delivery components comprising a bottom plate disposed at a bottom of the container body, a pair of side handles disposed at both sides of the container body, and a robotic flange disposed at a top of the container body, and card case components optionally disposed at a backside wall of the container body; and
   a lid adapted to seal the opening of the container body, the lid comprising a lid main body, a pair of latch mechanism disposed on the lid main body, a retainer member disposed at an inner surface of the lid main body, a seal gasket member disposed at a periphery of the lid main body such that it contacts a periphery of an opening part of the container body, and a lid cover,
   wherein the container body and the lid main body consist essentially of liquid crystal polymer, the robotic flange, the side handles, the bottom plate and the lid cover consist essentially of PEI, the latch mechanism and the retainer member consist essentially of PEEK, and the seal gasket member consist essentially of elastomeric resin.

7. The wafer storage container according to claim 6, wherein the container body and the lid main body are made electrically conductive by adding carbon fibers to the liquid crystal polymer, and the robotic flange and the bottom plate are made electrically conductive by adding carbon fiber to the PEI.

8. A wafer storage container comprising:
- a container body having an opening adapted to store wafers;
- delivery components attached to the exterior face part of the container body, the delivery components comprising a bottom plate disposed at a bottom of the container body, a pair of side handles disposed at both sides of the container body, and a robotic flange disposed at a top of the container body and card case components optionally disposed at a backside wall of the container body; and
- a lid adapted to seal the opening of the container body, the lid body comprising a lid main body, a pair of latch mechanism disposed within the lid main body, a retainer member disposed at an inner surface of the lid main body, a seal gasket member disposed at a periphery of the lid main body such that it contacts a periphery of an opening part of the container body, and a lid cover,
- wherein the container body, the bottom plate, the robotic flange, the lid main body, and the lid cover consist essentially of PEI and carbon fibers, the latch mechanism and the retainer consist essentially of PEEK, the seal gasket member consist essentially of thermoplastic elastomer.

9. The wafer storage container according to claim 8, wherein the wafer supports, robotic flange and the bottom plate are made electrically conductive by adding carbon fibers to the PEI.

* * * * *